US012790202B2

(12) United States Patent
Heller et al.

(10) Patent No.: US 12,790,202 B2
(45) Date of Patent: Nov. 10, 2026

(54) MEMS DEVICE AND MANUFACTURING METHOD THEREOF

(71) Applicant: ROHM CO., LTD., Kyoto (JP)

(72) Inventors: Martin Wilfried Heller, Kyoto (JP); Daisuke Kaminishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 424 days.

(21) Appl. No.: 18/464,759

(22) Filed: Sep. 11, 2023

(65) Prior Publication Data

US 2024/0092632 A1 Mar. 21, 2024

(30) Foreign Application Priority Data

Sep. 20, 2022 (JP) ................................ 2022-149346

(51) Int. Cl.
*B81B 3/00* (2006.01)
*B81C 1/00* (2006.01)

(52) U.S. Cl.
CPC .......... *B81B 3/0056* (2013.01); *B81C 1/0019* (2013.01); *B81B 2203/019* (2013.01); *B81B 2203/0315* (2013.01); *B81B 2203/033* (2013.01); *B81C 2201/0132* (2013.01)

(58) Field of Classification Search
CPC ................ B81B 3/0086; B81B 3/0056; B81B 2203/019; B81B 2203/0315; B81B 2203/033; B81C 1/0019; B81C 2201/0132; B81C 1/00142
See application file for complete search history.

(56) References Cited

U.S. PATENT DOCUMENTS

| | | | | |
|---|---|---|---|---|
| 6,239,473 B1 * | 5/2001 | Adams | B81C 1/00142 257/E21.546 |
| 2003/0106372 A1 * | 6/2003 | Adams | G01P 15/0802 73/514.32 |
| 2007/0119252 A1 * | 5/2007 | Adams | G01P 15/125 73/514.32 |
| 2021/0027965 A1 | 1/2021 | Miller et al. | |
| 2021/0188621 A1 * | 6/2021 | Peussa | B81B 3/0051 |
| 2023/0136105 A1 * | 5/2023 | Miller | B81B 3/0051 359/872 |

FOREIGN PATENT DOCUMENTS

| | | |
|---|---|---|
| JP | 2009-500635 A | 1/2009 |
| JP | 2021112817 A | 8/2021 |

OTHER PUBLICATIONS

Notice of Reasons for Refusal with search report issued on Apr. 28, 2026 in corresponding Japanese patent application No. 2022-149346 (25 pages; with English machine translation).

* cited by examiner

*Primary Examiner* — Moazzam Hossain
(74) *Attorney, Agent, or Firm* — Rabin & Berdo. P.C.

(57) ABSTRACT

The present disclosure provides a MEMS device. The MEMS device includes: a substrate; a recess, disposed in the substrate; a movable portion, hollowly supported in the recess; and an isolation joint, inserted into a predetermined position of the movable portion and electrically insulating both sides of the movable portion. A shortest distance between a bottom of the recess and the movable portion is less than a distance between the bottom of the recess and the isolation joint.

9 Claims, 10 Drawing Sheets

MEMS DEVICE AND MANUFACTURING METHOD THEREOF

TECHNICAL FIELD

The present disclosure relates to a microelectromechanical system (MEMS) device and a manufacturing method thereof, and more particularly to an MEMS device that ensures insulation of an isolation joint (hereinafter referred to as "IJ") disposed at a movable portion and prevents IJ damage accompanied with deformation of the movable portion, and a manufacturing method thereof.

BACKGROUND

A conventional MEMS device has a structure hollowly provided with a beam structure portion. The beam structure portion is formed by means of etching a silicon substrate on a cavity provided for etching the silicon substrate. In the beam structure portion, an isolation joint of an insulative trench formed by means of silicon oxidation is disposed, and the beam structure portion is electrically insulated at a predetermined position.

PRIOR ART DOCUMENT

Patent Publication

[Patent document 1] Japan Patent Publication No. 2009-500635

DETAILED DESCRIPTION OF THE EMBODIMENTS

<Device Structure>

Figure 1:
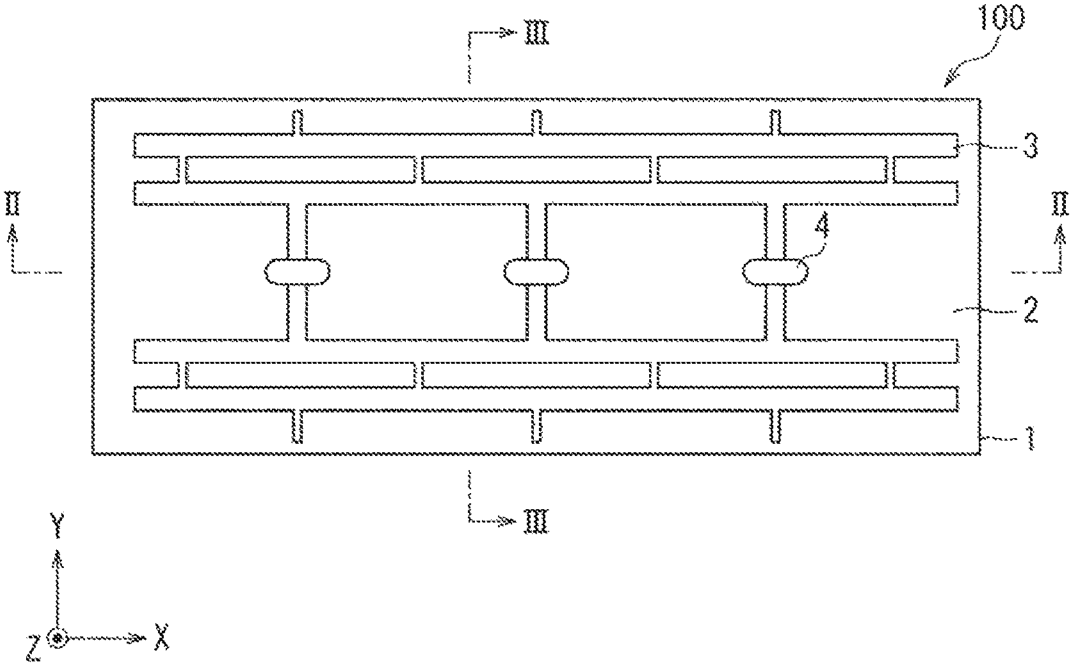
FIG. 1 is a top view of an MEMS device according to an embodiment of the present disclosure.
Figure 2:
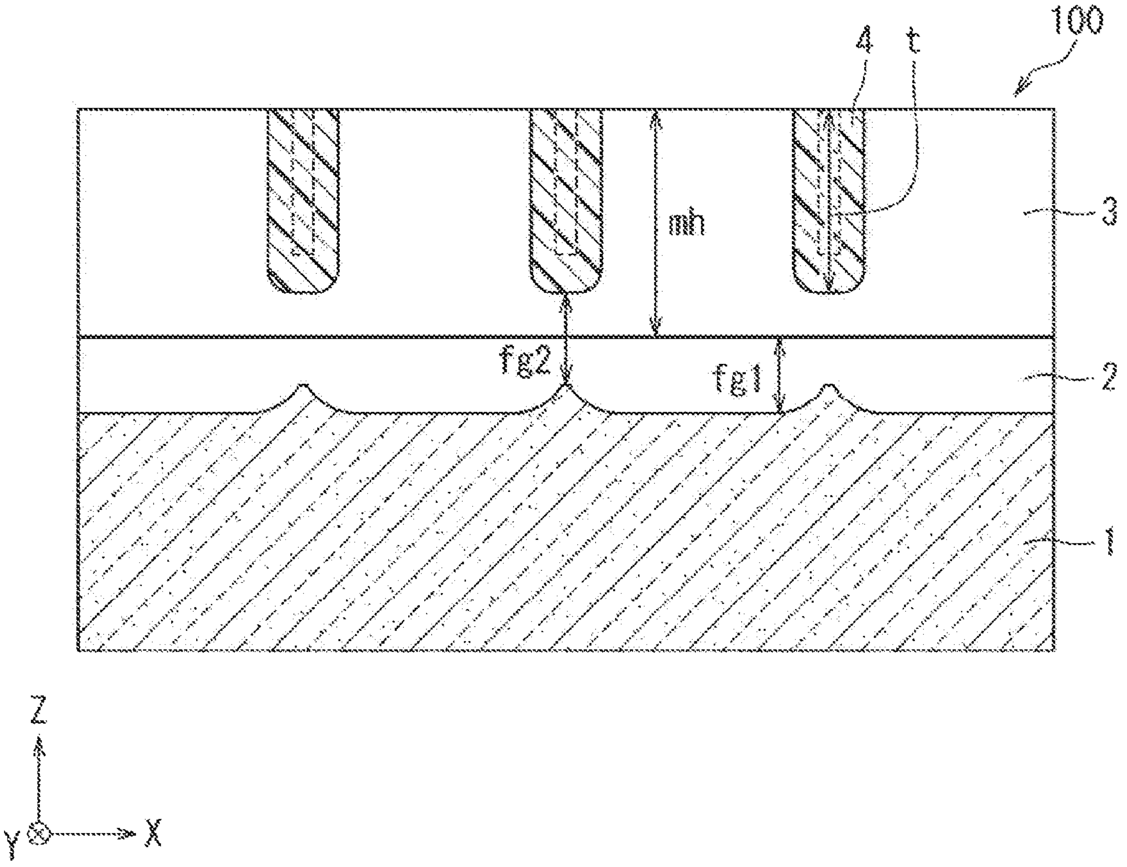
FIG. 2 is a cross-sectional diagram of the MEMS device in FIG. 1 observed along the II-II direction.
Figure 3:
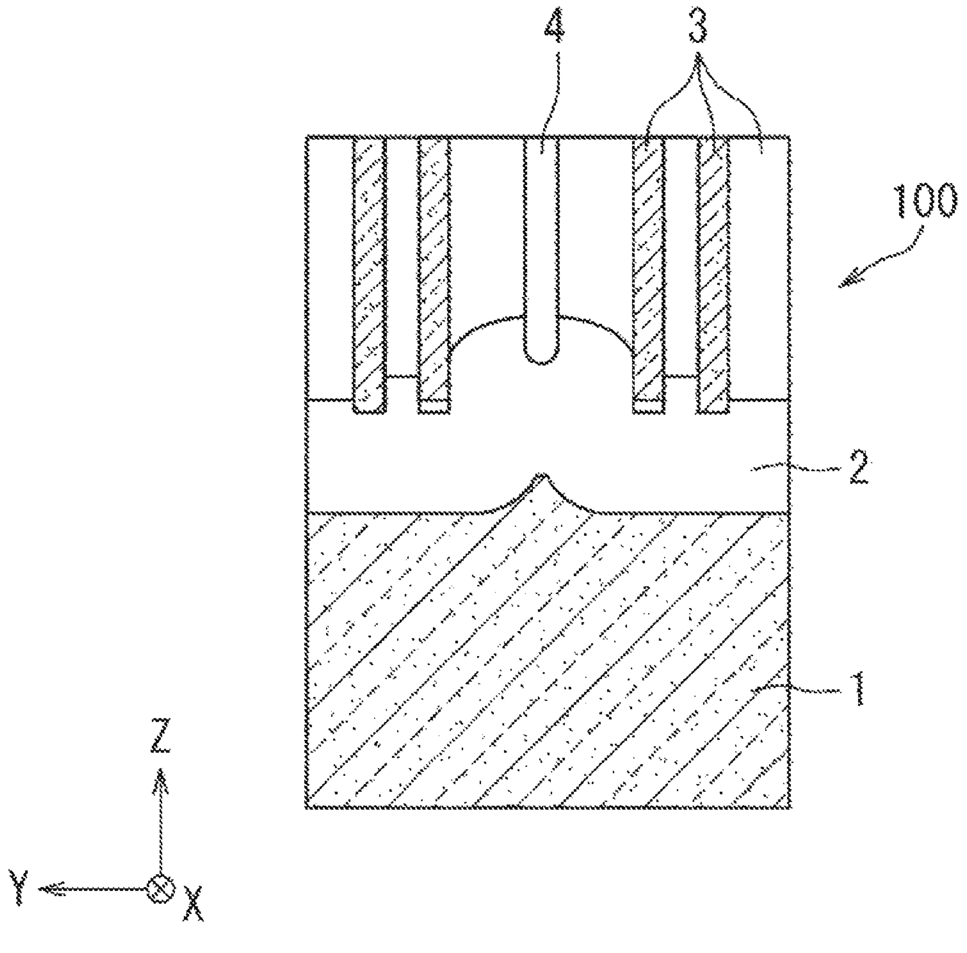
FIG. 3 is a cross-sectional diagram of the MEMS device in FIG. 1 observed along the III-III direction.

FIG. 1 shows a top view of an overall microelectromechanical system (MEMS) device 100 according to an embodiment of the present disclosure. FIG. 2 shows a cross-sectional diagram of the MEMS device 100 in FIG. 1 observed along the II-II direction. FIG. 3 shows a cross-sectional diagram of the MEMS device 100 in FIG. 1 observed along the III-III direction.

The MEMS device 100 has a cavity (recess) 2 disposed in a silicon substrate 1. Above the cavity 2, a movable portion (beam structure portion) 3 formed of the silicon substrate 1 is kept hollow. An isolation joint (IJ) 4 is disposed at a predetermined position of the movable portion 3 to electrically insulate the movable portion 3. In FIG. 1, the IJ 4 is disposed at three parts of the movable portion 3; however, the present disclosure is not limited to such configuration. Moreover, electrodes or wires can be disposed as needed.

As shown by the dashed lines in FIG. 2, at a joining portion of the movable portion 3 and the IJ 4, a cross section (represented by dotted lines) of the movable portion 3 is smaller than a cross section of the movable portion 3 and is configured on the inside, hence ensuring insulation. Thus, a lower end of the IJ 4 becomes a structure protruding further downward in comparison with a lower end of the adjacent movable portion 3.

On the other hand, as shown in FIG. 3, apart from the side of the IJ 4 (the movable portion extending along the X-axis direction in FIG. 1), the lower end of the movable portion 3 is closer to the bottom than the lower end of the IJ 4. In FIG. 3, the thickness of a portion of the movable portion 3 having a largest film thickness (for example, the movable portion 3 in the uppermost part in FIG. 1) is set as mh, a distance (shortest distance) between that portion of the movable portion 3 and a bottom portion of the cavity 2 is set as fg1, the thickness of the IJ 4 is set as t, and a distance between the IJ 4 and the bottom of the cavity 2 (as described below, a distance to a protrusion when the protrusion is present right below the IJ 4) is set as fg2. Herein, the distance refers to a distance in the Z-axis direction.

In the MEMS device 100 of this embodiment, (1) $mh>t$, and (2) $fg1<fg2$.

Thus, although the movable portion 3 moves along the Z-axis direction when the MEMS device 100 operates, the movable portion 3 is in contact with the bottom of the cavity 2 before the IJ 4 comes into contact with the bottom of the cavity 2. Accordingly, an end portion of the IJ 4 in a protruding shape can be prevented from coming into contact with the bottom of the cavity 2, the damage of the IJ 4 and the reduced insulation arising therefrom are prevented.

As such, in the MEMS device 100 of this embodiment, the MEMS device 100 capable of forming a sufficient space below the IJ 4, preventing the damage of the IJ 4 and achieving better reliability can be provided.

<Manufacturing Method>

Referring to FIG. 4 to FIG. 13, a method for manufacturing the MEMS device 100 according to the embodiment of the present disclosure is described below. The manufacturing method includes steps 1 to 6 below. In FIG. 4 to FIG. 13, the numerals or symbols same as those in FIG. 1 to FIG. 3 represent the same or equivalent parts.

Figure 4:
FIG. 4 is a top view of manufacturing processes of an MEMS device according to an embodiment of the present disclosure.
Figure 5:
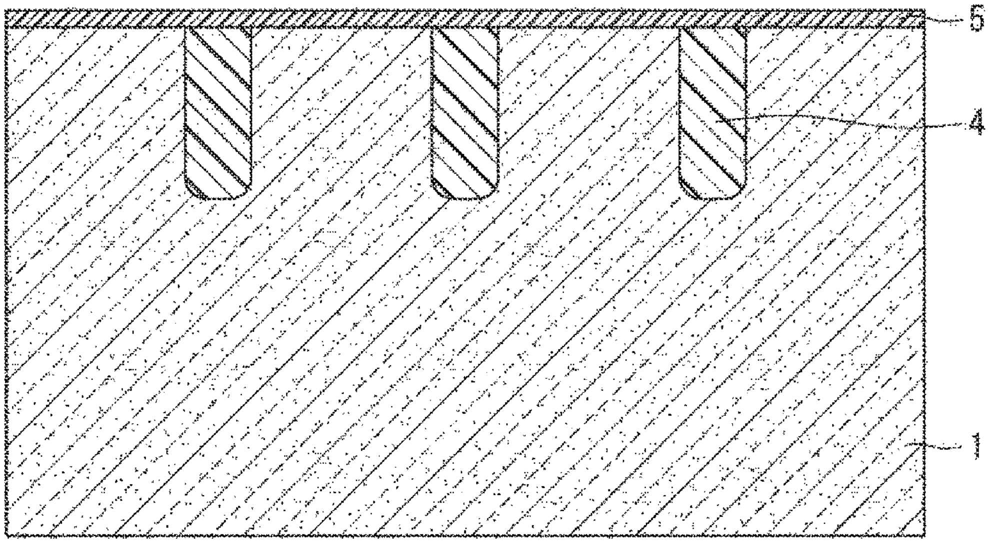
FIG. 5 is a cross-sectional diagram of the MEMS device in FIG. 4 observed along the V-V direction.

For step 1, FIG. 4 shows a top view of the MEMS device 100 in step 1, and FIG. 5 shows a cross-sectional diagram of the MEMS device 100 in FIG. 4 observed along the V-V direction. In step 1, first of all, a silicon substrate 1 including monocrystalline silicon and having an obverse side and a reverse side is prepared.

Next, the silicon substrate 1 is etched from the obverse side to form a trench, and an inner surface of the trench is thermally oxidized to fill the trench by the silicon oxide, so as to form an isolation joint (IJ) 4. By means of chemical vapor deposition (CVD), an oxide film 5 including silicon oxide is formed on the obverse side of the silicon substrate 1

Figure 6:
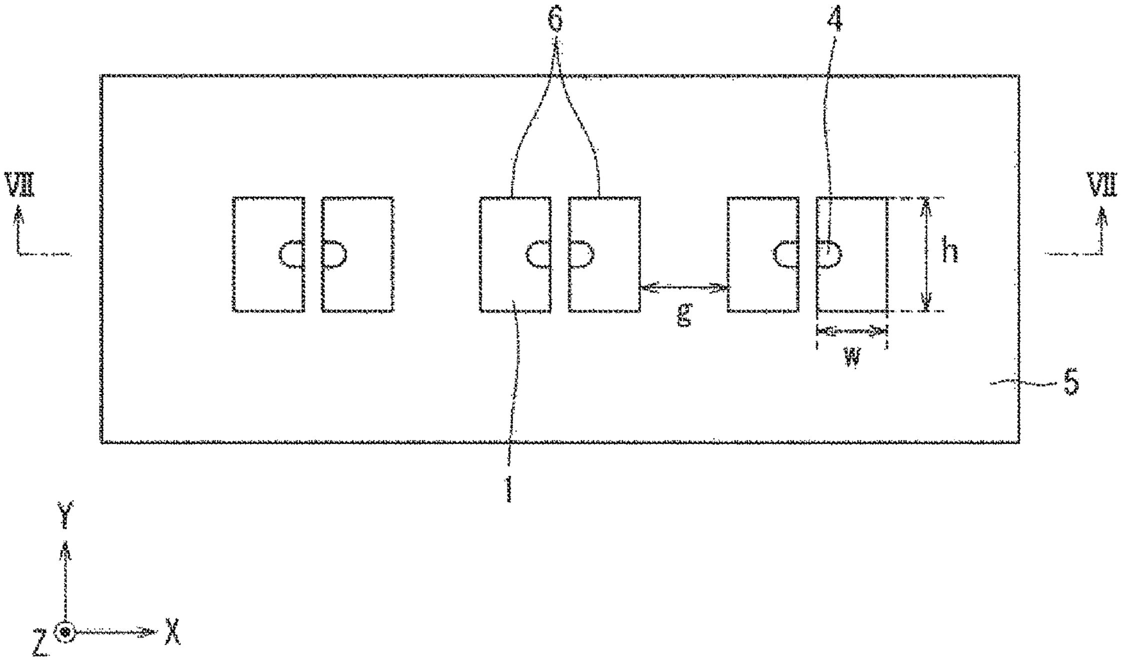
FIG. 6 is a top view of manufacturing processes of an MEMS device according to an embodiment of the present disclosure.
Figure 7:
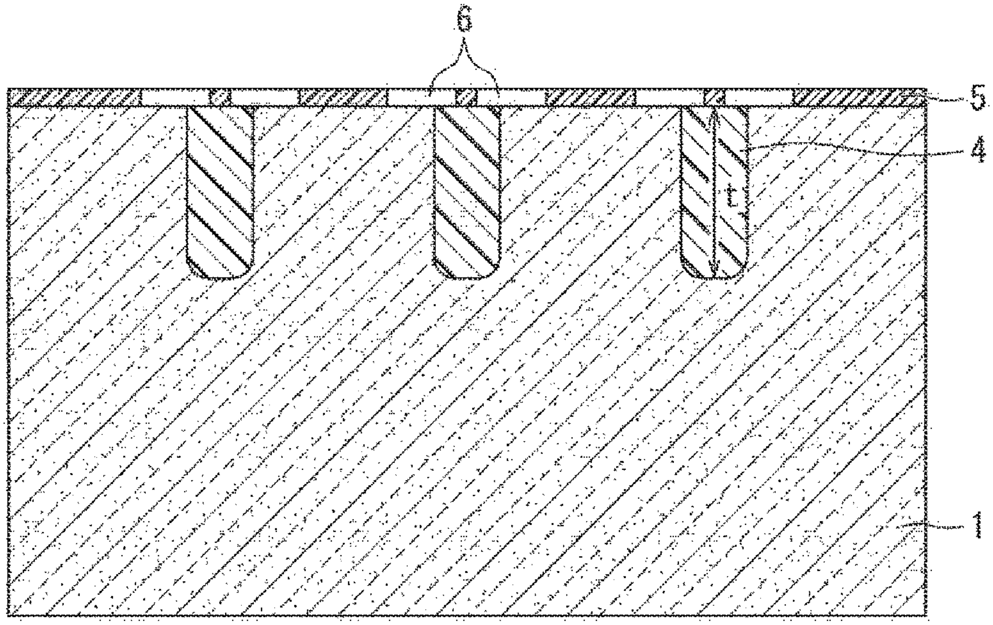
FIG. 7 is a cross-sectional diagram of the MEMS device in FIG. 6 observed along the VII-VII direction.

For step 2, FIG. 6 shows a top view of the MEMS device 100 in step 2, and FIG. 7 shows a cross-sectional diagram of the MEMS device 100 in FIG. 6 observed along the VII-VII direction. A photoresist film (not shown) is formed on the oxide film 5 to pattern the oxide film 5, so as to form a rectangular opening portion 6. The obverse side of the silicon substrate 1 is exposed from the opening portion 6.

As shown in FIG. 6, two opening portions 6 spaced by the IJ 4 are arranged symmetrically to expose both ends of the IJ 4 extending along the X-axis direction. Sandwiched between the two opening portions 6, a region passing through a center of the IJ 4 and extending along the Y-axis direction becomes a movable portion 3 connected to the IJ 4 in a subsequent step.

The shapes of both of the opening portions 6 are preferably the same; for example, the width of the opening portion 6 in the X-axis direction is w, the width in the Y-axis direction is h, and a gap of the opening portion 6 in the X-axis direction not spaced by the IJ 4 is g. Moreover, the depth of the IJ 4 is t.

Figure 8:
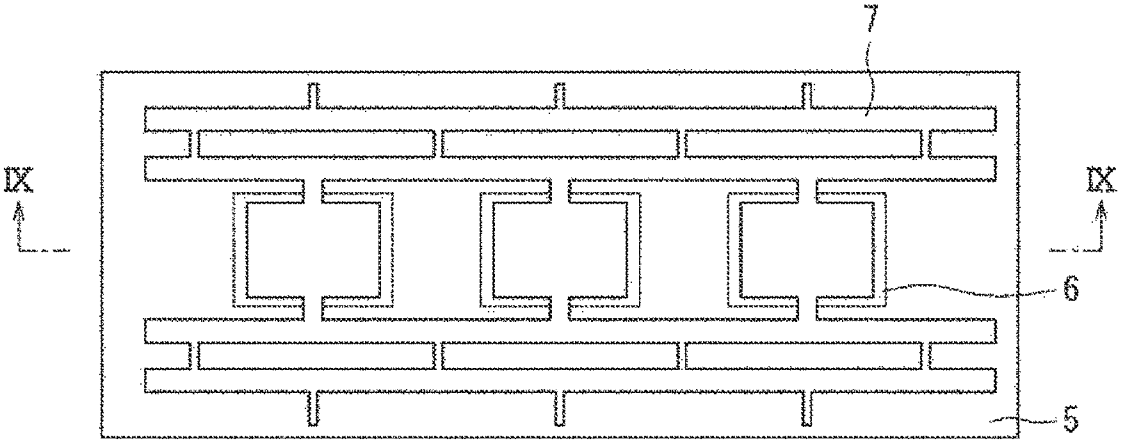
FIG. 8 is a top view of manufacturing processes of an MEMS device according to an embodiment of the present disclosure.
Figure 9:
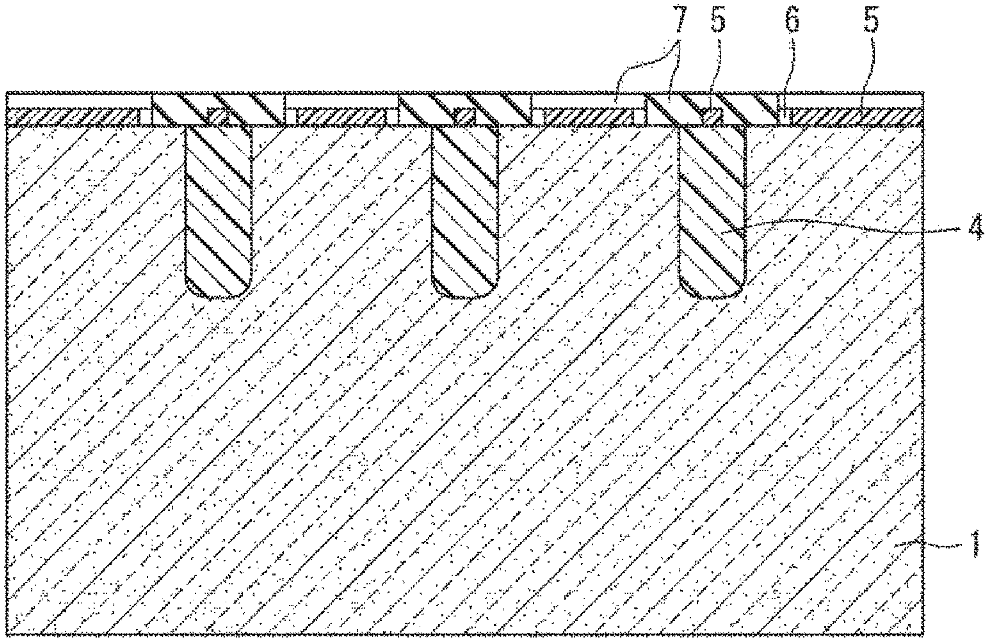
FIG. 9 is a cross-sectional diagram of the MEMS device in FIG. 8 observed along the IX-IX direction.

For step 3, FIG. 8 shows a top view of the MEMS device 100 in step 3, and FIG. 9 shows a cross-sectional diagram of the MEMS device 100 in FIG. 8 observed along the IX-IX direction. After the photoresist layer is formed on the oxide film 5, patterning is performed by means of photolithography. Accordingly, an etch resist mask 7 is formed in a region in which the movable portion 3 is to be formed and in a region covering the opening portion 6.

The periphery of the etch resist mask 7 formed to cover the opening portion 6 is preferably slightly closer to the inside than the opening portion 6 (by less than 1 μm, for example, 500 nm). The reason for the above is to prevent residuals of the oxide film 5 from leaving behind in an etching step (step 4) of the oxide film 5 to be described below.

Figure 10:
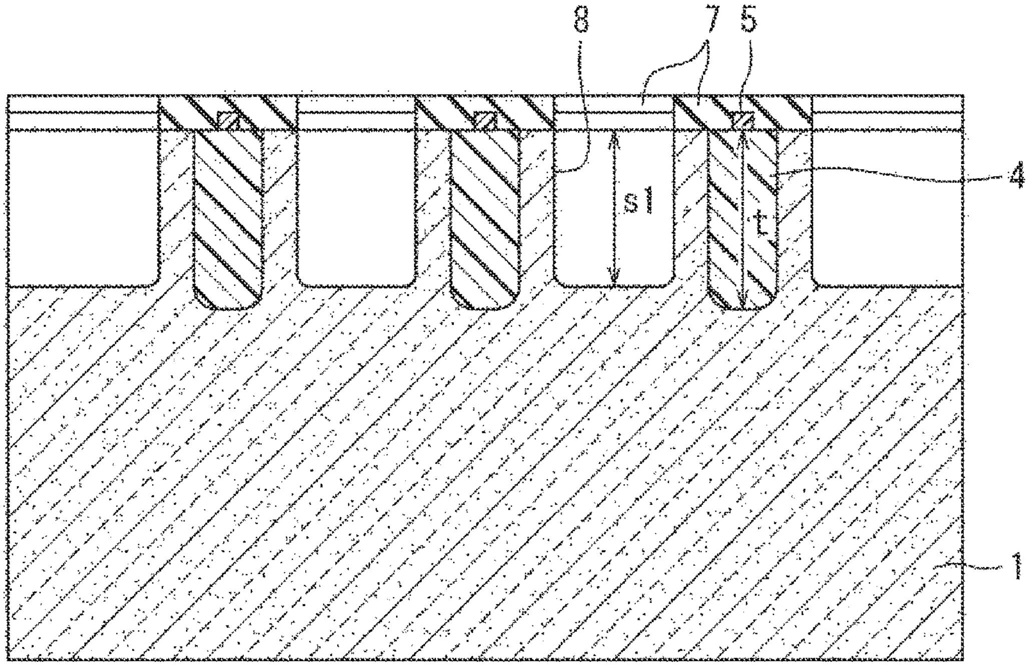
FIG. 10 is a cross-sectional diagram of manufacturing processes of an MEMS device according to an embodiment of the present disclosure observed along the IX-IX direction in FIG. 8.

For step 4, FIG. 10 shows a cross-sectional diagram of the MEMS device 100 in step 4, and is a cross-sectional diagram observed along the same direction as the IX-IX direction in FIG. 8. In step 4, first of all, the etch resist mask 7 is used as an etch mask, and for example, hydrofluoric acid solution is used to remove the oxide film 5.

Next, the etch resist mask 7 is used as an etch mask, and the silicon substrate 1 is etched (referred to as "first structural etching") by means of deep reactive ion etching (DRIE) to form a trench 8. A depth s1 of the trench is preferably equal to or shallower than the depth t of the IJ 4.

In DRIE, a Bosch process is used, for example. In one example, the etching step (by using an $SF_6$ gas at 5 Pa for 7 seconds) and a protection step (by using a $C_4F_8$ gas at 2.5 Pa for 5 seconds) are performed repeatedly, and the silicon substrate 1 is etched while a sidewall of the trench 8 is protected by a protective film. The depth of etching can be controlled by the number of times of repeating these two steps.

Figure 11:
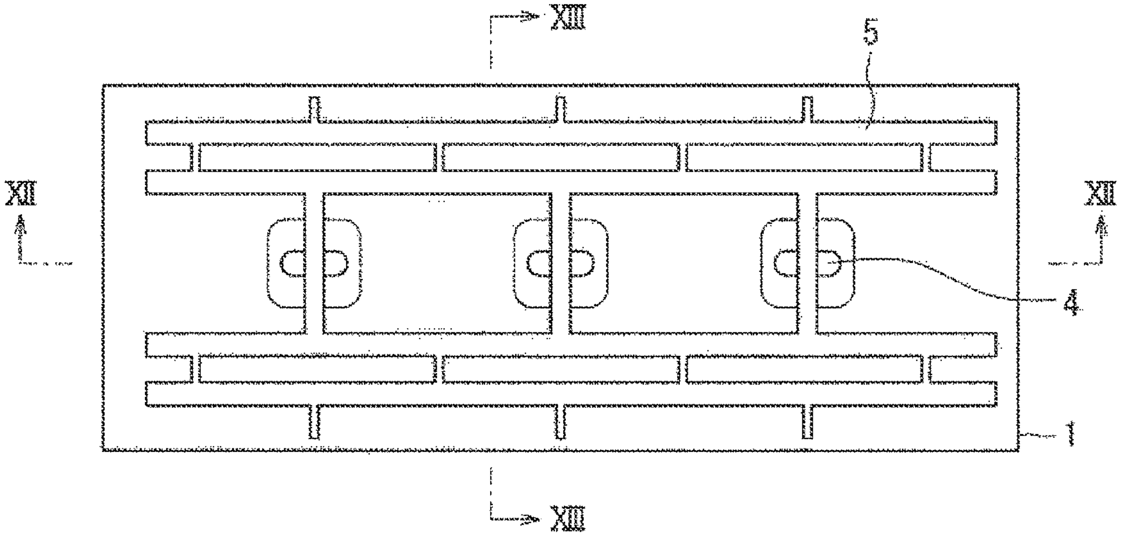
FIG. 11 is a top view of manufacturing processes of an MEMS device according to an embodiment of the present disclosure.
Figure 12:
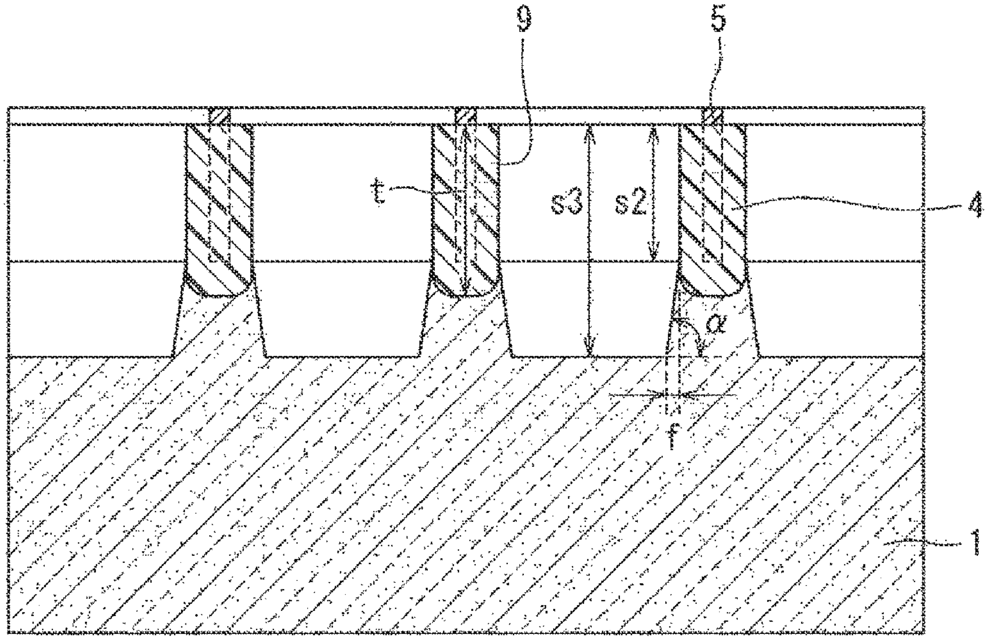
FIG. 12 is a cross-sectional diagram of the MEMS device in FIG. 11 observed along the XII-XII direction.
Figure 13:
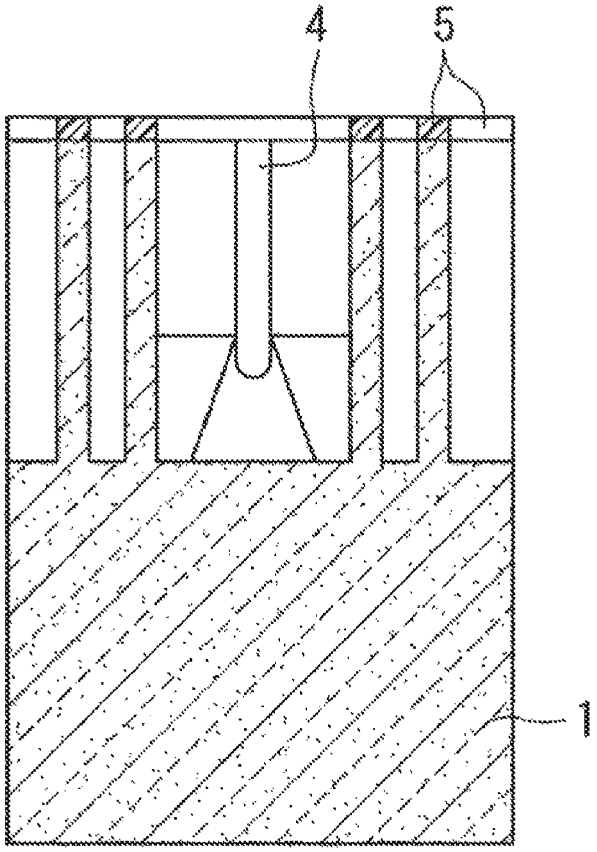
FIG. 13 is a cross-sectional diagram of the MEMS device in FIG. 11 observed along the XIII-XIII direction.

For step 5, FIG. 11 shows a top view of the MEMS device 100 in step 5, FIG. 12 shows a cross-sectional diagram of the MEMS device 100 in FIG. 11 observed along the XII-XII direction, and FIG. 13 shows a cross-sectional diagram of the MEMS device 100 in FIG. 11 observed along the XIII-XIII direction.

As shown in FIG. 12, first of all, for example, an organic solvent is used to remove the etch resist mask 7. Next, the IJ 4 including silicon oxide and the oxide film 5 thereon are used as a mask (hard mask), and the silicon substrate 1 is etched by means of DRIE (referred to as "second structural etching") to form a trench 9. By selecting the sizes (w, h and g) of the opening portion 6 and etching conditions, a depth of a region adjacent to the trench 9 and the IJ 4 becomes s2, and a depth between two IJs 4 becomes s3. The depth s2 is shallower than the depth t of the IJ 4. In the first structural etching (referring to FIG. 10) of step 4, the etch resist mask 7 is present, and so the silicon substrate 1 is not etched and remains to surround the IJ 4 after the DRIE. In the following second structural etching (referring to FIG. 12) of step 5, the etch resist film 7 is removed and DRIE is performed, and so at a timing at which an etch depth of the region adjacent to the IJ 4 becomes s2, an etch depth of the trench 9 between the two IJs 4 becomes s3 (approximately equal to s1+s2) and a tapered shape is formed between the two. Herein, the length of the tapered portion in the X-axis direction is set as f.

For step 6, after the oxide film is formed on the inner wall of the trench 9 formed in the silicon substrate 1, the oxide film at the bottom and on the tapered portion is removed, such that the oxide film remains on the sidewall (the inner wall in the Z-axis direction). Next, a cavity 2 (expansion) is formed by means of isotropic etching, so that the movable portion 3 becomes in a state of floating (release) from the silicon substrate 1.

Herein, when an inclined (elevation) angle of the tapered portion with respect to the horizontal direction is set to α (referring to FIG. 12), tan α=(s3−s2)/f; in this case, α is preferably about 60° to 85°. That is, by configuring the inclined angle of the tapered portion to be 60° to 85°, good expansion and release can be achieved in step 6.

Lastly, the oxide film 5 remaining on the movable portion 3 is removed by using vapor of hydrofluoric acid, accordingly completing the MEMS device 100 of the embodiment of the present disclosure as shown in FIG. 1 to FIG. 3.

<Process Simulation>

Figure 14:
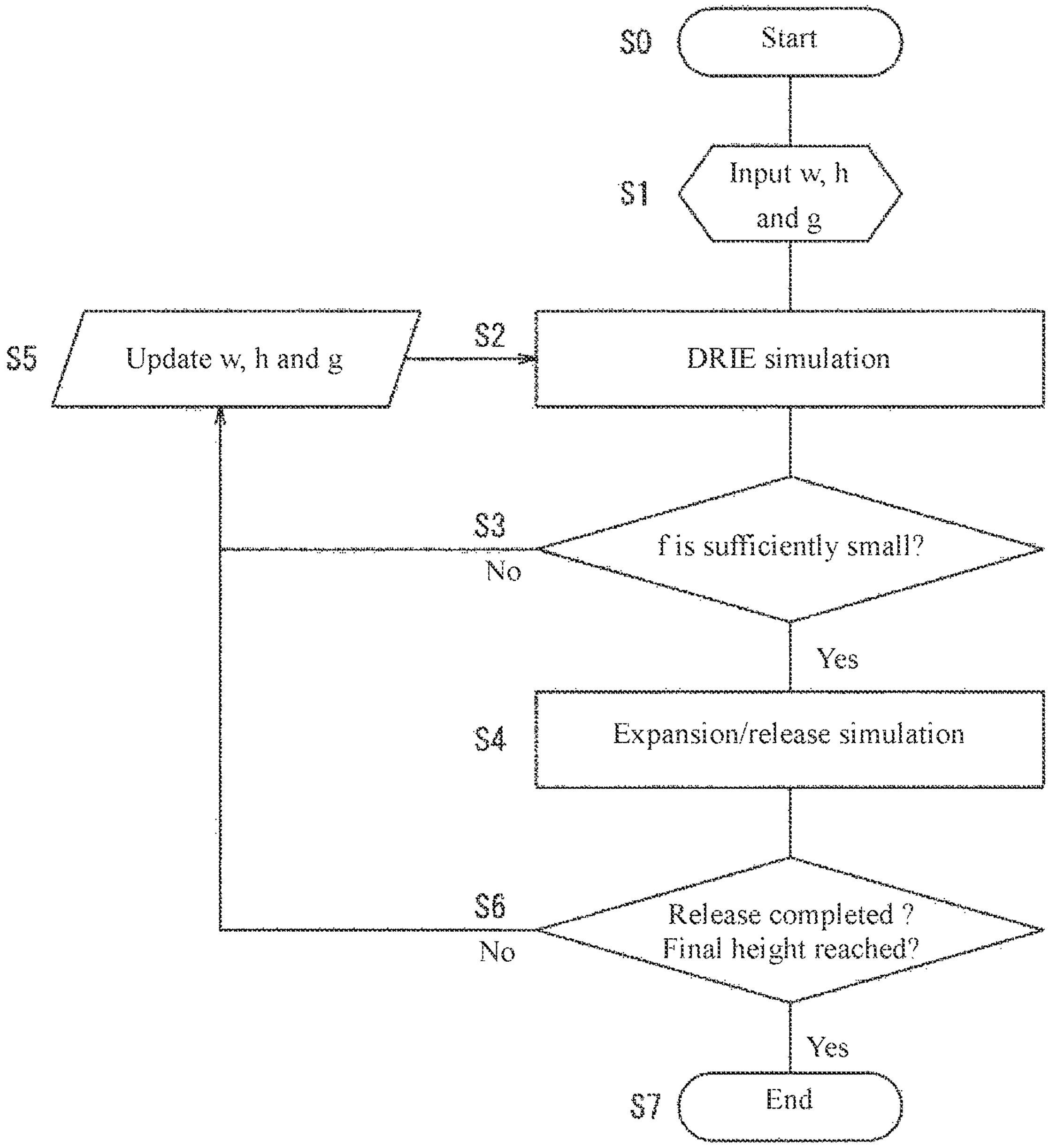
FIG. 14 is a flowchart of a process simulation of an MEMS device according to an embodiment of the present disclosure.

FIG. 14 shows an example a process simulation for determining manufacturing parameters of the MEMS device 100. After the simulation starts in S0, the width w in the X-axis direction, the width h in the Y-axis direction and the gap g of the opening portion 6 in FIG. 6 are assumed in S1 first.

Next in S2, DRIE simulation (first structural etching and second structural etching) is performed to obtain s1, s2 and s3 shown in FIG. 12.

Next, it is determined in S3 whether f is sufficiently small. More specifically, when it is set that tan α=(s3−s2)/f, it is determined whether α is within a range of 60° to 85°.

If so (YES), simulation of expansion-release is performed in S4. On the other hand, S5 is performed if not (NO), the values of the widths w and h and the gap g are updated, and the DRIE simulation of S2 is performed again.

For the expansion-release simulation result of S4, it is determined in S6 whether the movable portion 3 is fully released, and whether the height from the bottom surface of the cavity 2 to the movable portion 3 fully becomes a final height. More specifically, it is determined whether mh>t and fg1<fg2 (referring to FIG. 2).

If the result of S6 is YES, the process simulation ends in S7, and the values of the widths w and h and the gap g are determined. On the other hand, if the result is NO, the values of the widths w and h and the gap g are updated again in S5, and the simulation is repeatedly performed.

As such, by optimizing the parameters (w, h and g) associated with the opening portion 6 formed in step 2 (FIG. 6), the MEMS device 100 having a good structure that meets mh>t and fg1<fg2 can be obtained.

NOTES

The present disclosure relates to a microelectromechanical system (MEMS) device having a movable portion, comprising:

- a substrate;
- a recess, disposed in the substrate;
- the movable portion, hollowly supported in the recess; and
- an isolation joint, inserted into a predetermined position of the movable portion and electrically insulating both sides of the movable portion,
- wherein a shortest distance (fg1) between a bottom of the recess and the movable portion is less than a distance (fg2) between the bottom of the recess and the isolation joint (fg1<fg2).

The present disclosure is capable of providing an MEMS sensor that is capable of preventing the protruding isolation joint from coming into contact with the bottom of the cavity, thereby preventing damage of the isolation joint and reduced insulation arising therefrom as well as achieving high reliability.

In the present disclosure, a depth (s2) of the movable portion adjacent to the isolation joint is less than a depth (t) of the isolation joint.

With the use of the configuration, insulation of the isolation joint is ensured.

In the present disclosure, the movable portion includes a portion having a depth (mh) greater than the depth (t) of the isolation joint.

With the use of the configuration, before the isolation joint comes into contact with the bottom of the cavity, the movable portion is in contact with the bottom of the cavity, the damage of the isolation joint can be prevented even if the movable portion moves.

In the present disclosure, the distance (fg2) between the bottom of the recess and the isolation joint is a distance between a lower end of the isolation joint and a protrusion formed at the bottom of the recess.

With the use of the configuration, even if the protrusion is formed at the bottom of the recess, the lower end of the isolation joint can be prevented from coming into contact with the recess.

The present application relates to a manufacturing method, which is a method for manufacturing a microelectromechanical system (MEMS) device including a movable portion with an isolation joint, the method comprising steps of:

- forming the isolation joint in a substrate including a trench filled with a dielectric material;
- a first structural etching step of etching the substrate using a mask covering the substrate above and around the isolation joint to form a first trench;
- after removing the mask, a second structural etching step of etching the substrate using the isolation joint as an etching mask to form a second trench; and
- etching the substrate in the second trench while protecting a sidewall of the second trench to form a recess and the movable portion, wherein the movable portion is hollowly supported in the recess and includes the isolation joint,
- wherein a depth of the sidewall of the second trench is less than a depth of the isolation joint.

With the use of the manufacturing method comprising the first structural etching step and the second structural etching step, an MEMS sensor that ensures the insulation of the isolation joint can be manufactured and the damage of the isolation joint can also be prevented.

In the present disclosure, the second trench has a tapered portion tapered from a lower end of the sidewall toward a bottom surface of the second trench, and an inclined (elevation) angle ($\alpha$) of the tapered portion with respect to the bottom surface is between about 60° and about 85°.

By controlling the inclined angle of the tapered portion as above, an expected MEMS sensor can be manufactured.

INDUSTRIAL APPLICABILITY

The present disclosure is applicable to MEMS sensors such as acceleration sensors or pressure sensors, and MEMS devices such as print heads and digital micromirror devices.

The invention claimed is:

1. A microelectromechanical system (MEMS) device having a movable portion, comprising:

- a substrate;
- a recess, disposed in the substrate;
- the movable portion, hollowly supported in the recess; and
- an isolation joint, inserted into a predetermined position of the movable portion and electrically insulating both sides of the movable portion, wherein
- a shortest distance between a bottom of the recess and the movable portion is less than a distance between the bottom of the recess and the isolation joint, and
- a depth of the movable portion at a location directly adjacent to the isolation joint is less than a depth of the isolation joint.

2. The MEMS device of claim 1, wherein the movable portion includes a portion having a depth greater than the depth of the isolation joint.

3. The MEMS device of claim 1, wherein the distance between the bottom of the recess and the isolation joint is a distance between a lower end of the isolation joint and a protrusion formed at the bottom of the recess.

4. The MEMS device of claim 3, wherein the protrusion is positioned directly below the isolation joint.

5. The MEMS device of claim 1, wherein a lower end of the isolation joint protrudes further downward than a lower end of the movable portion at the location directly adjacent to the isolation joint.

6. The MEMS device of claim 1, wherein a cross section of the movable portion at the location directly adjacent to the isolation joint is smaller than a cross section of the isolation joint.

7. The MEMS device of claim 1, wherein

- a maximum depth of the movable portion is greater than the depth of the isolation joint, wherein
- the maximum depth of the movable portion is measured along a vertical direction corresponding to a downward direction of the isolation joint.

8. The MEMS device of claim 1, wherein
the substrate comprises a silicon substrate, and
the isolation joint comprises silicon oxide formed in a trench etched in the silicon substrate.

9. The MEMS device of claim 1, wherein
the isolation joint divides the movable portion into a first portion on a first side of the isolation joint and a second portion on a second side of the isolation joint, wherein
the first portion and the second portion are electrically insulated from each other by the isolation joint.

* * * * *